United States Patent
Besser et al.

(10) Patent No.: US 9,484,251 B1
(45) Date of Patent: Nov. 1, 2016

(54) CONTACT INTEGRATION FOR REDUCED INTERFACE AND SERIES CONTACT RESISTANCE

(71) Applicant: Lam Research Corporation, Fremont, CA (US)

(72) Inventors: Paul Raymond Besser, Sunnyvale, CA (US); William Worthington Crew, Jr., North Plains, OR (US); Sanjay Gopinath, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/929,039

(22) Filed: Oct. 30, 2015

(51) Int. Cl.
  *H01L 21/22* (2006.01)
  *H01L 21/768* (2006.01)
  *H01L 21/285* (2006.01)
  *H01L 21/265* (2006.01)

(52) U.S. Cl.
  CPC ... *H01L 21/76841* (2013.01); *H01L 21/26513* (2013.01); *H01L 21/28556* (2013.01); *H01L 21/28568* (2013.01)

(58) Field of Classification Search
  CPC ............... H01L 21/76841; H01L 21/26513; H01L 21/28556; H01L 21/28568
  See application file for complete search history.

(56) References Cited

U.S. PATENT DOCUMENTS

| 8,603,882 B2 | 12/2013 | Chen et al. | |
| 2007/0123042 A1* | 5/2007 | Rim | H01L 21/28518 438/683 |
| 2012/0322246 A1 | 12/2012 | Wang et al. | |
| 2013/0320408 A1* | 12/2013 | Chen | H01L 21/265 257/288 |

OTHER PUBLICATIONS

Fuller et al., "Introduction to Ion Implantation," Rochester Institute of Technology, available at http://people.ritedu/lffeee/IMPLANT.pdf, Jan. 20, 2012.
Besser et al., "Silicide challenges for 22nm technologies and beyond," ECS Transactions, 13 (1), pp. 377-388, 2008.
"Plasma Immersion Ion Implantation," Ion Beam Services, available at http://www.ionbeamservices.com/nano_sys.htm, Downloaded Oct. 21, 2015.
"Plasma-immersion ion implantation," Wikipedia, the free encyclopedia, available at https://en.wikipedia.org/w/index.php?title=Plasma-immersion_ion_implantation&oldid=668177075, Last modified Jun. 22, 2015, Downloaded Oct. 6, 2015.
Gupta, Dushyant, "Plasma Immersion Ion Implantation (PIII) Process—Physics and Technology," International Journal of Advancements in Technology, vol. 2, No. 4, ISSN 0976-4860, pp. 471-490, Oct. 2011.

* cited by examiner

*Primary Examiner* — Peter Bradford
(74) *Attorney, Agent, or Firm* — Weaver Austin Villeneuve & Sampson LLP

(57) ABSTRACT

Methods of lightly implanting platinum, iridium, osmium, erbium, ytterbium, dysprosium, and gadolinium in semiconductor material in shallow depths by plasma-immersion ion implantation (PIII) and/or pulsed PIII are provided herein. Methods include depositing a liner layer prior to masking and implanting features to form n-type and p-type semiconductors and implanting materials through the liner layer. Methods are suitable for integration schemes involving fabrication of fin-type field effect transistors (FinFETs).

18 Claims, 10 Drawing Sheets

CONTACT INTEGRATION FOR REDUCED INTERFACE AND SERIES CONTACT RESISTANCE

BACKGROUND

Semiconductor manufacturing processes involve fabrication of field-effect transistors and contacts. Conventional fabrication of contact interfaces to semiconductor material involves sputtering of various materials to reduce contact resistance at the interface. As semiconductor devices scale to smaller and smaller technology nodes, shrinking feature dimensions makes deposition of such materials in small features more challenging.

SUMMARY

Provided herein are methods for processing semiconductor substrates. One aspect involves a method of forming contacts on a substrate, the method including (a) after etching the substrate to form two or more contact holes, forming a p-type semiconductor by implanting a first material by plasma immersion ion implantation into a first semiconductor material; and (b) forming a n-type semiconductor by implanting a second material by plasma immersion ion implantation into a second semiconductor material. The first material may be any of platinum, iridium, and osmium and the second material may be any of erbium, ytterbium, dysprosium, and gadolinium.

In various embodiments, the method also includes prior to (a), conformally depositing a liner layer including titanium on the substrate. In various embodiments, the first material is implanted through the liner layer. In some embodiments, the second material is implanted through the liner layer.

The first material may be deposited to a depth between about 1 nm and about 4 nm. In some embodiments, the second material is deposited to a depth between about 1 nm and about 4 nm. In some embodiments, doping concentration of the first material is about $5 \times 10^{14}$ atoms/cm$^2$. In some embodiments, doping concentration of the second material is about $5 \times 10^{14}$ atoms/cm$^2$.

In various embodiments, the second semiconductor material is one of silicon and silicon germanium. In various embodiments, the first semiconductor material is one of silicon, silicon carbide, and silicon carbon phosphide.

The method may further include: (c) after forming the n-type semiconductor and the p-type semiconductor, filling the two or more contact holes with a metal.

In some embodiments, filling the two or more contact holes with the metal includes depositing fluorine-free tungsten. In some embodiments, the fluorine-free tungsten is deposited in the two or more contact holes without depositing a liner layer. In some embodiments, the fluorine-free tungsten is deposited by exposing the substrate to a metal organic tungsten-containing precursor and a reducing agent. In some embodiments, the fluorine-free tungsten is deposited by exposing the substrate to a chlorine-containing tungsten-containing precursor and a reducing agent. In some embodiments, the fluorine-free tungsten is deposited directly on the implanted n-type and p-type semiconductors. In some embodiments, filling the two or more contact holes with the metal includes electroplating copper onto the substrate.

In various embodiments, the method also includes (d) depositing a first silicon nitride layer by chemical vapor deposition between performing (a) and (b); (e) depositing a second silicon nitride layer by chemical vapor deposition after performing (b); and (f) opening the first and silicon nitride layer prior to performing (c).

These and other aspects are described further below with reference to the drawings.

DETAILED DESCRIPTION

Figure 1:
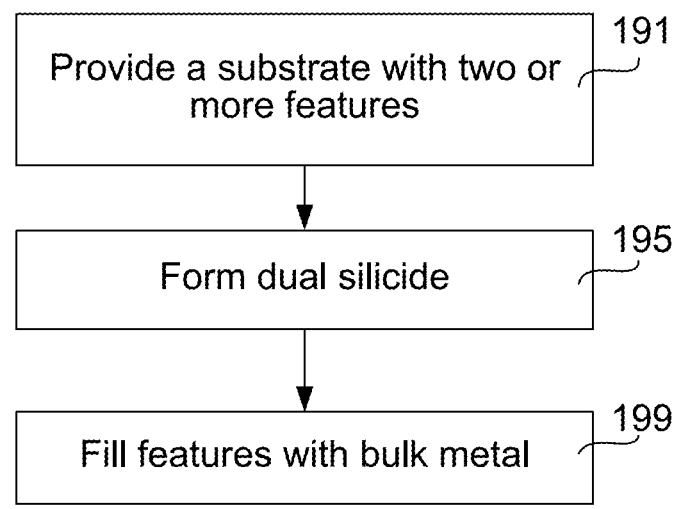
FIG. 1 is a process flow diagram depicting operations for processing a semiconductor substrate.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Integrated circuits continue to be fabricated at increasingly smaller dimensions. However, the small size of certain semiconductor devices, such as field-effect transistors (FETs), leads to certain problems. For example, a short channel length can result in short-channel effects where the source and/or drain regions exert undue influence over the channel or carriers in the channel. These short-channel effects can lead to a reduced ability of a gate to exercise control over the channel. Advantageously, these effects are reduced when 3D devices are used in place of planar devices. A fin-type field-effect transistor (FinFET) structure is a metal-oxide-semiconductor field-effect transistor (MOSFET) on a silicon on insulator (SOI) substrate whereby silicon (or polysilicon) is etched into a fin-shaped body of the transistor. Where a FinFET is used, a gate has increased control over the channel because the gate wraps around three of the four sides of the channel (i.e., the gate contacts two lateral surfaces of the channel and the top surface of the channel).

FinFET fabrication may be part of an integration scheme for forming contacts to surfaces of semiconductor material of the FinFET structure. Device performance is often dependent on the resistance of the contact interface. Conventional methods involved forming nickel silicide (NiSi) at the contact interface but this material is a mid-gap work function material (0.65 eV) in silicon and is susceptible to forming "pipes" of NiSi$_2$. Some conventional methods of reducing contact resistance have involved forming a metal-insulator-silicon (MIS) structure, but integration of titanium oxide (TiO$_2$) or silicon oxide (SiO$_2$) in MIS structures may result in unstable structures during subsequent processing of the semiconductor substrate.

Some other conventional techniques have involved fabrication of low resistance silicides at the contact interface. Some methods have also involved depositing titanium metal directly on a silicon substrate without forming a silicide. Titanium is deposited by methods such as physical vapor deposition (PVD). A self-aligned silicide ("salicide") is formed at the contact interface by depositing a metal such as titanium on the semiconductor substrate surface and annealing the substrate to form an intermetallic, while unreacted metal is then removed with a wet etch process. Some other conventional deposition methods included depositing titanium by PVD directly on a semiconductor surface, followed by depositing a titanium nitride (TiN) cap by chemical vapor deposition (CVD). However, as devices shrink and contact dimensions scale to smaller dimensions, the high resistance TiN layer consumes much of the contact fill, thereby rendering contact fill material incapable of being deposited into the feature. Semiconductor manufacturing techniques to reduce the amount of high resistance TiN in a feature have involved expensive integration techniques to etch the material and fill the contact or metal gate with a lower resistance metal.

One method of forming a low contact resistance interface between the contact metal and the semiconductor surface on n-type semiconductors and p-type semiconductors is to use different materials for each, which is referred to as "dual silicide" integration. Conventional techniques attempted to form dual silicides to reduce silicide to silicon resistance. However, such techniques were incapable of fabricating dual silicides with various metals because the materials are prone to oxidation and difficult to etch and deposit by sputtering.

Provided herein are methods of depositing platinum, iridium, osmium, erbium, ytterbium, dysprosium, and gadolinium metals by lightly implanting semiconductor material by plasma-immersion ion implantation (PIII). Although embodiments described herein may be implemented by performing PII, any other ion implantation method that is capable of performing shallow implantation as described herein may be used. Embodiments are suitable for integration with FinFET applications following fin formation and contact etch to expose the source and drain regions as further described below. Some embodiments include more than one masking operations to form a dual silicide. In some embodiments, disclosed embodiments eliminate the use of a titanium-containing liner layer in the contact, allowing other materials to be used for the contact, such as cobalt deposited by CVD, cobalt deposited by atomic layer deposition (ALD), or tungsten carbonitride deposited by ALD. Lower resistance contact fill material may also be used, such as tungsten deposited by CVD, fluorine-free tungsten, electrochemical deposition of cobalt (e.g., plating or electroless plating).

FIG. 1 provides a general process flow diagram depicting an example integration scheme that may be used with disclosed embodiments. In operation 191, a substrate is provided. The substrate may be a silicon wafer, e.g., a 200-mm wafer, a 300-mm wafer, or a 450-mm wafer, including wafers having one or more layers of material such as dielectric, conducting, or semi-conducting material deposited thereon.

A patterned substrate may have two or more "features" such as vias or contact holes, and high aspect ratios. The features may be formed in one or more of the above described layers. One example of a feature is a hole or via in a semiconductor substrate or a layer on the substrate. The methods described herein can be used to fill vertical features, such as in tungsten vias, and horizontal features. For example, prior to operation 191, a fin structure may be fabricated for a FinFET type transistor and the substrate may be etched to form contact holes over the source and drain regions of the FinFET structure. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

Figure 2A:
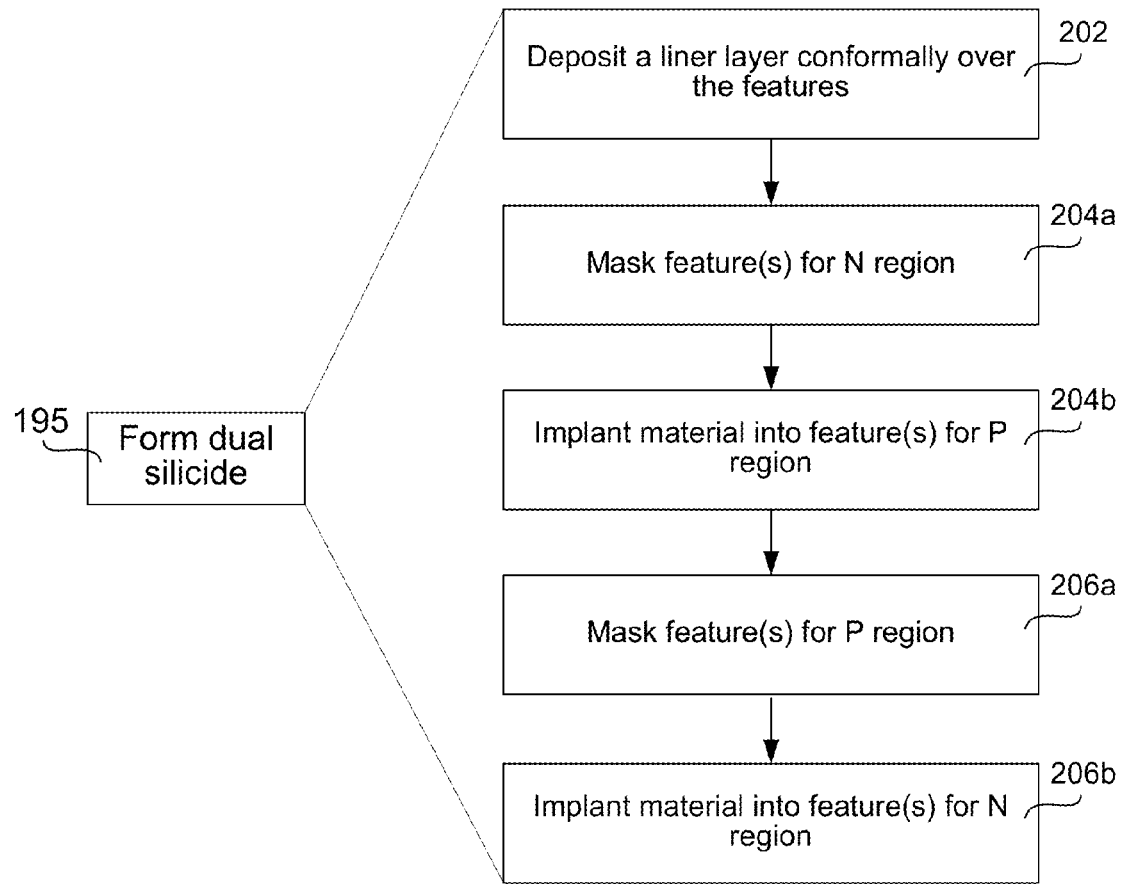
FIG. 2A is a process flow diagram depicting operations for performing certain embodiments.
Figure 3:
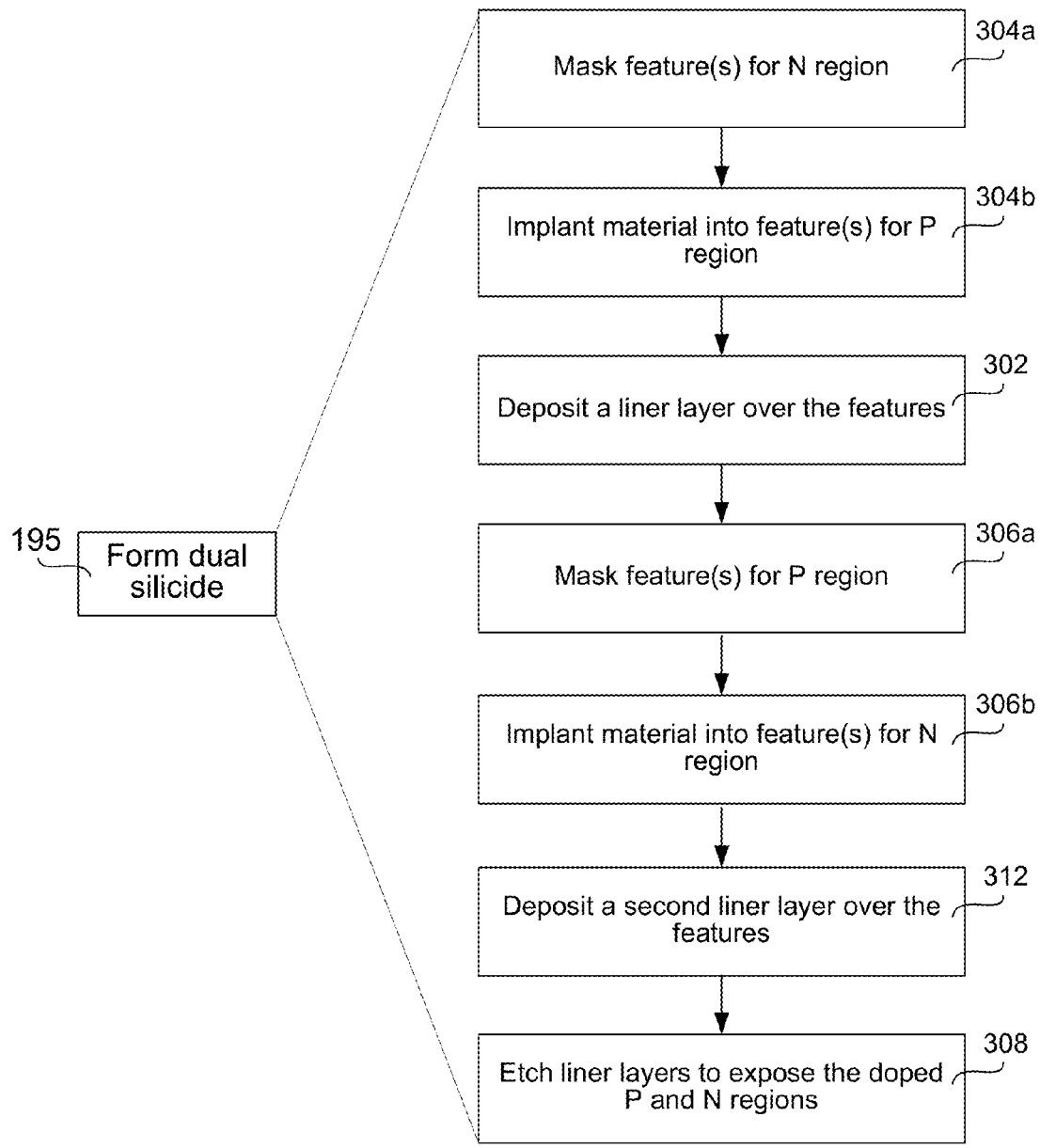
FIG. 3 is a process flow diagram depicting operations for performing certain embodiments.
Figure 4:
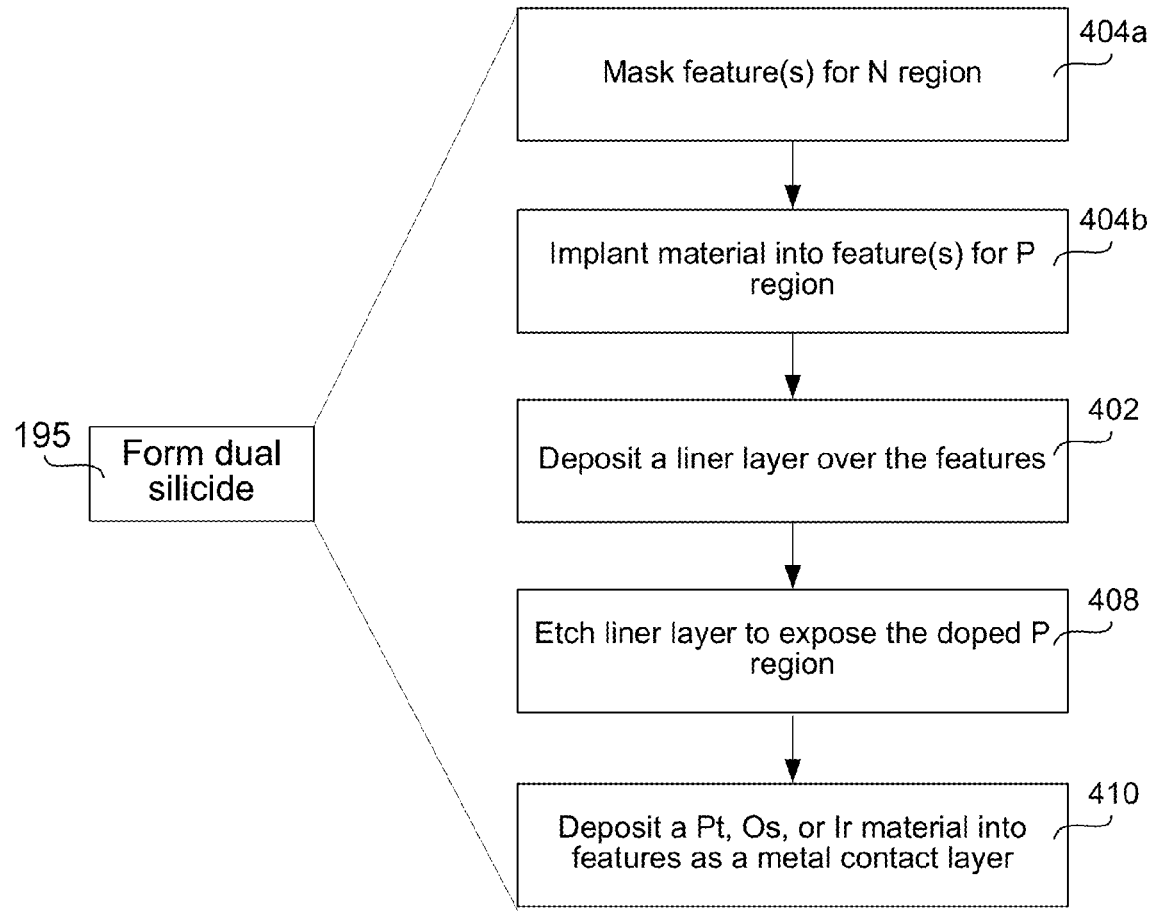
FIG. 4 is a process flow diagram depicting operations for performing certain embodiments.

Returning to FIG. 1, in operation 195, a dual silicide is formed. FIGS. 2A, 3, and 4 provide further process flow diagrams for example methods of forming dual silicides using disclosed embodiments. Disclosed implementations may form dual silicide using an integration scheme involving operations for implanting material to form implanted n-type and implanted p-type semiconductors using plasma immersion ion implantation as further described below.

In operation 199, the features are filled with a bulk metal. As described above, example bulk metals include cobalt, fluorine-free tungsten, and tungsten. Methods include CVD, ALD, PVD, and plating such as electroplating or electroless plating.

In various embodiments, resistance at the contact interface may be reduced by implanting materials as described herein, followed by depositing fluorine-free tungsten. Fluorine-free tungsten may be deposited by ALD and/or CVD by exposing the substrate to a chlorine-containing tungsten precursor, such as tungsten pentachloride ($WCl_5$) or tungsten hexachloride ($WCl_6$). Further examples of depositing fluorine-free tungsten using chlorine-containing tungsten precursors are described in U.S. patent application Ser. No. 14/703,732, entitled "METHODS OF PREPARING TUNGSTEN AND TUNGSTEN NITRIDE THIN FILMS USING TUNGSTEN CHLORIDE PRECURSOR" filed on May 4, 2015, which is herein incorporated by reference in its entirety.

Disclosed embodiments may be performed in a cluster tool or in more than one tool for performing various operations of an integration scheme. For example, deposition, etching, and removal of a photoresist used for masking in various embodiments may be performed in a chamber separate from the implanting operations.

Figure 2B:
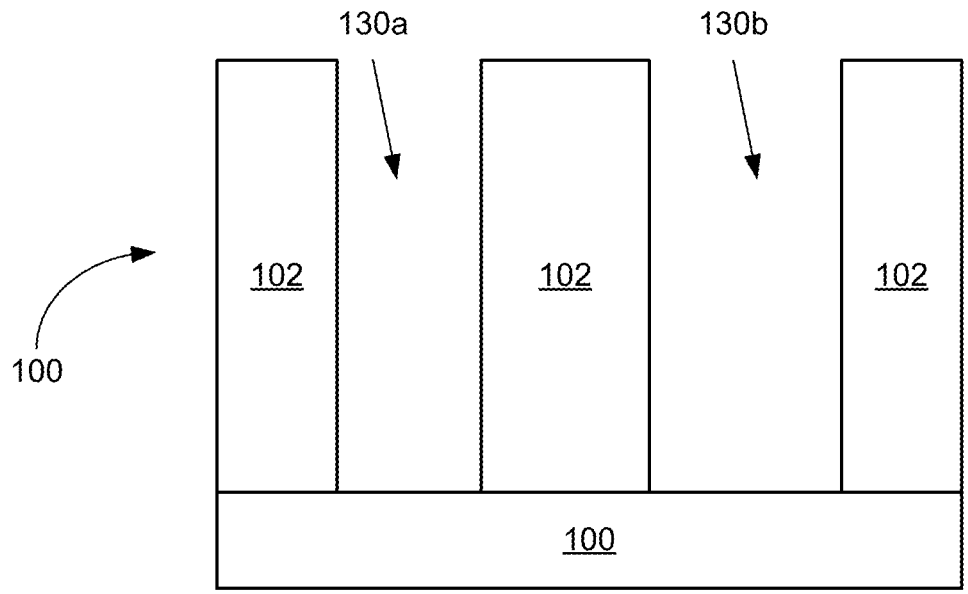
FIGS. 2B-2J are schematic illustrations of substrates undergoing various operations of disclosed embodiments.
Figure 2C:
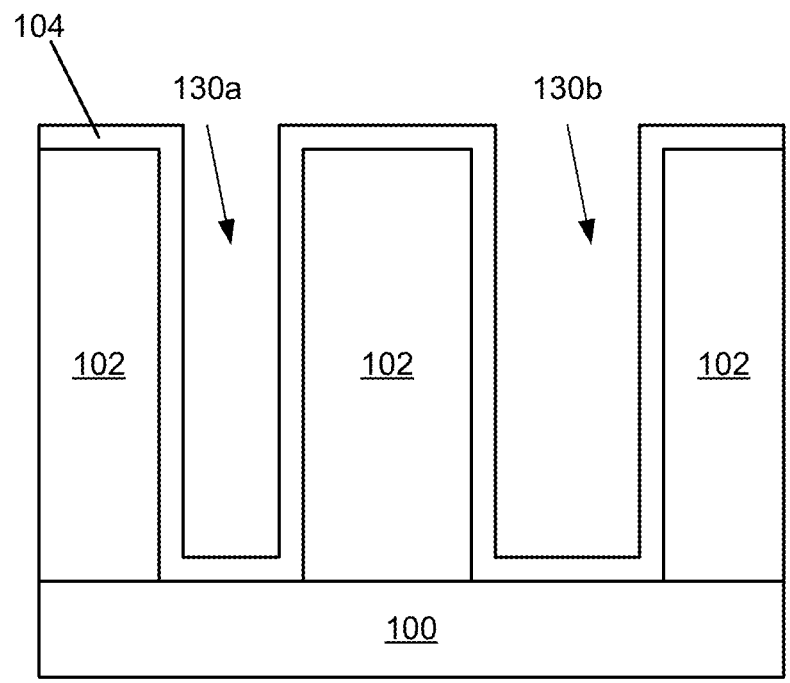

FIG. 2A is a process flow diagram depicting an example of performing operation 195 of FIG. 1 in accordance with certain embodiments. A substrate is provided as described above. FIG. 2B shows an example of a substrate with a semiconductor material 100 and etched dielectric material 102 to form features 130*a* and 130*b*. In various embodiments, operation 195 may be formed over a FinFET structure (not shown). In FIG. 2A, in operation 202, a liner layer is deposited conformally over the features. FIG. 2C shows a liner layer 104 deposited conformally over the features 130*a* and 130*b*. In various embodiments, the semiconductor material 100 may be silicon or silicon germanium, such as when performing disclosed embodiments to form a p-type semiconductor material in a dual silicide. In various embodiments, the semiconductor material 100 may be silicon or silicon carbide or silicon carbon phosphide, such as when performing disclosed embodiments to implant an n-type semiconductor material in a dual silicide.

In some embodiments, the liner layer deposited in operation 202 includes two or more liner layers. Liner layers may include metal-containing materials, such as titanium, or titanium nitride. In various embodiments, a titanium liner layer is deposited conformally over the features. The liner layer may be a silicon nitride layer deposited by CVD. In various embodiments, the liner layer may be conformally deposited by ALD. In various embodiments, the liner layer may be deposited to a thickness between about 1 nm and about 10 nm.

Figure 2D:
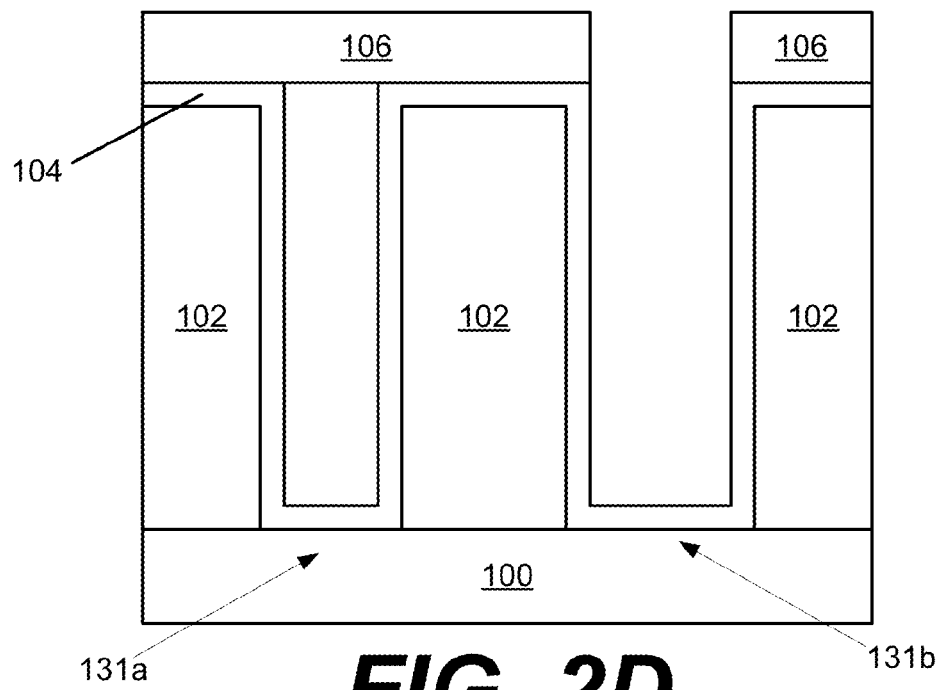

In operation 204a, features that may be used for forming an N region may be masked such that P regions are exposed. An N region as described herein may refer to either an area of a semiconductor material for forming an n-type semiconductor or a lightly implanted n-type semiconductor region. A P region as described herein may refer to either an area of a semiconductor material for forming a p-type semiconductor or a lightly implanted p-type semiconductor region. Masking an N region may include depositing and patterning a mask over the substrate. For example, in some embodiments, a photoresist may be used. FIG. 2D provides an example of a mask 106 over feature 130a and accordingly, N region 131a, leaving an exposed 131b region at the bottom of feature 130b.

Returning to FIG. 2A, in operation 204b, material is lightly implanted into exposed semiconductor regions. Example materials include material with a band gap greater than 0.8 eV, such as iridium, platinum, and osmium. Barrier heights of various silicides are described in "Silicide challenges for 22 nm technologies and beyond" by Besser et al., 13 (1) ECS Transactions 377-388 (2008). The material may be implanted using a plasma doping technique such as PIII or a pulsed PIII, which involve a surface modification technique that extracts accelerated ions from a plasma by applying a high voltage pulsed DC or pure DC power supply and targets them into a suitable substrate or electrode with a semiconductor wafer placed over it, so as to implant it with suitable dopants. The electrode is a cathode for an electropositive plasma, while it is an anode for an electronegative plasma.

PIII or pulsed PIII allows low energy doping that may be controlled to implant to a shallow depth in the semiconductor material. Implantation depth may be between about 1 nm and about 4 nm, or between about 1 nm and about 2 nm. Plasma can be generated in a suitably designed vacuum chamber with the help of a plasma source. In this case where a metallic species is implanted at an ultra-low energy, a grid can be used.

The directionality and extent of implantation can be tailored depending on the implantation energy and dose (e.g., amount of atoms generated from the plasma). The concentration of doping may be modulated to achieve a ratio of silicon to the material of about 1:1. For example, concentration of doping may be selected to achieve a ratio of silicon to platinum of about 1:1. Example doping concentrations may be about $5 \times 10^{14}$ atoms/cm$^2$ on the surface of the semiconductor material.

Figure 2E:
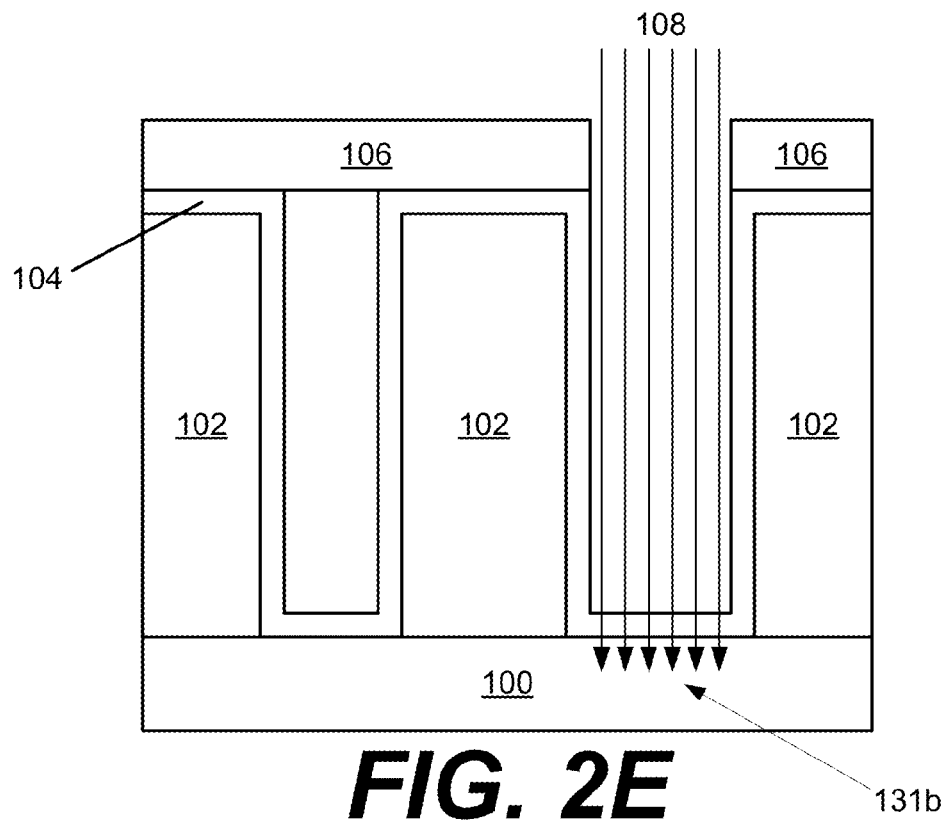
Figure 2F:
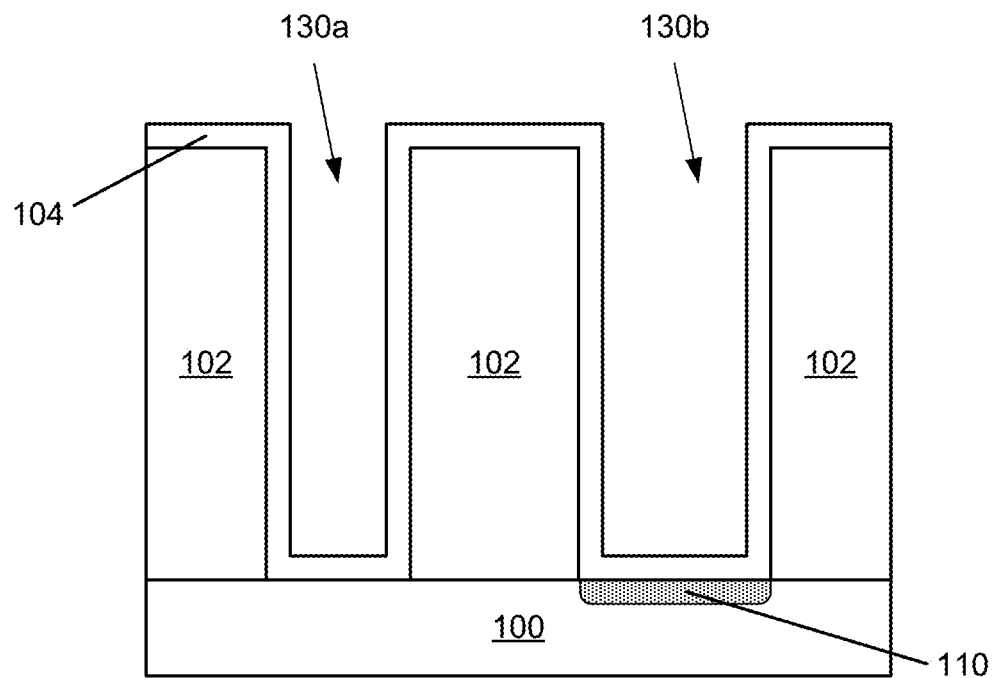

FIG. 2E provides an example of ions 108 of a plasma implanting into feature 130b toward region 131b. FIG. 2F shows a lightly implanted p-type semiconductor surface 110. Note that the implantation may occur through the liner layer 104, as shown in both FIGS. 2E and 2F. This may protect an implanted region 110 from being exposed to oxidation. In FIG. 2F, the mask has also been removed.

Figure 2G:
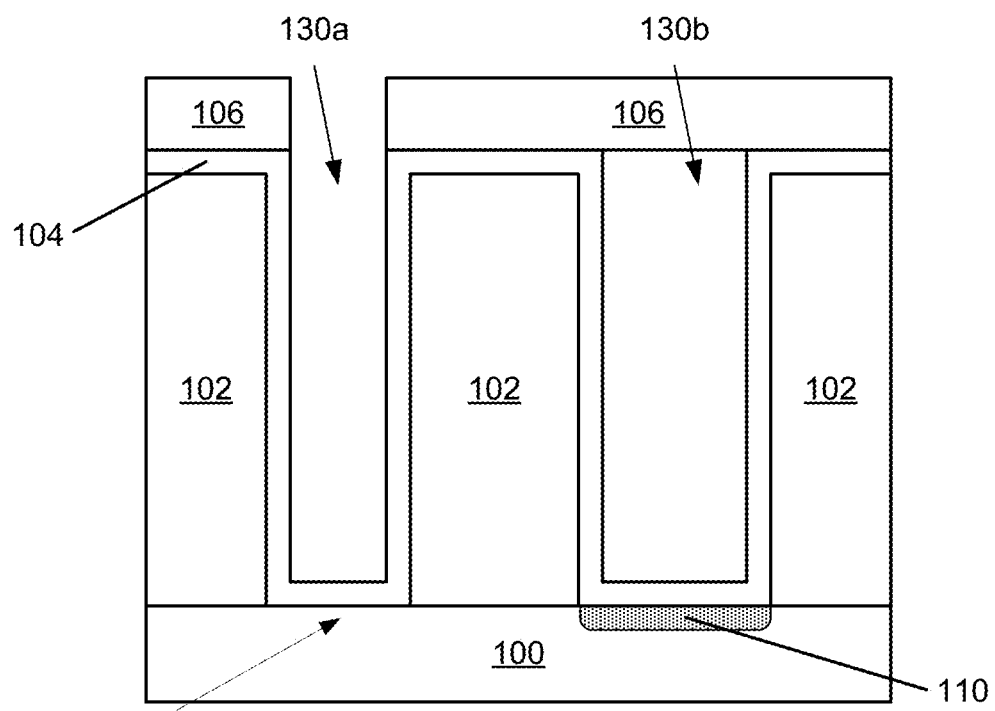
Figure 2H:
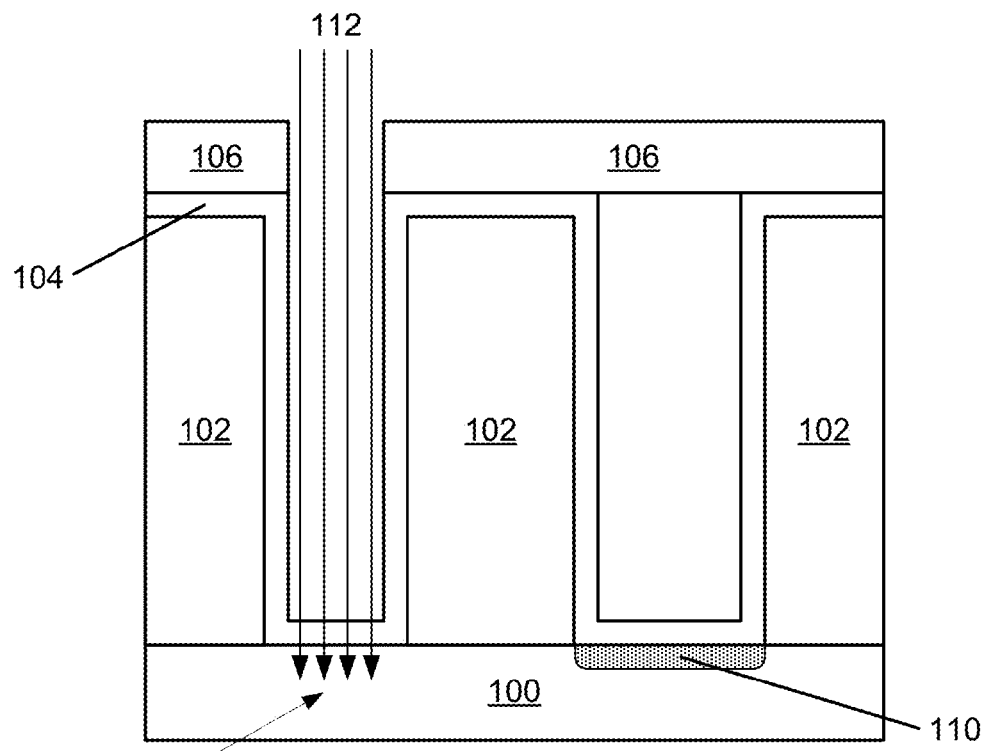
Figure 2I:
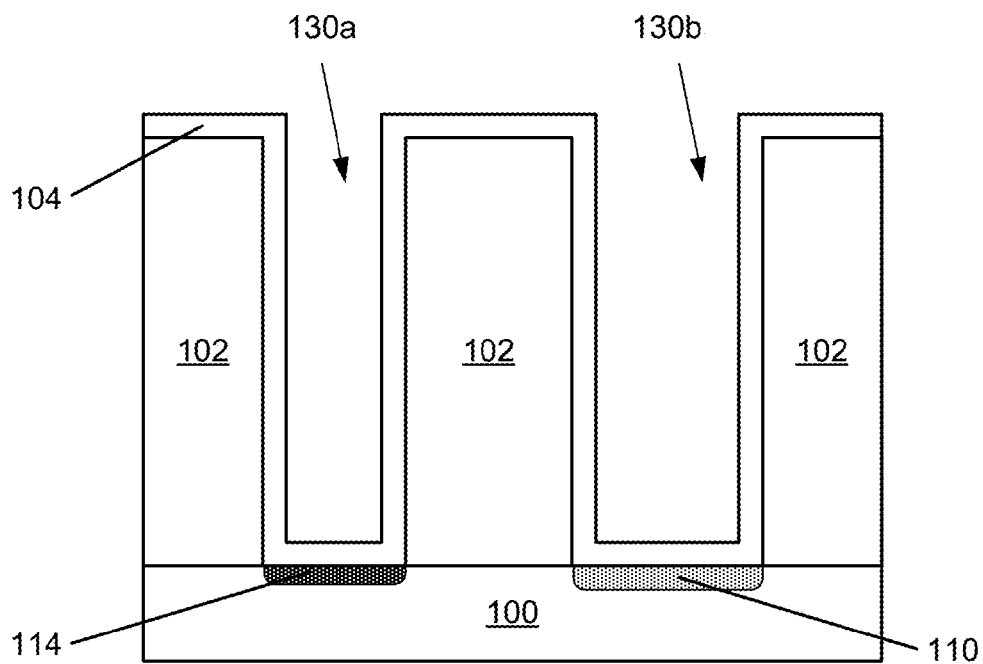

Returning to FIG. 2A, in operation 206a, features are masked over P regions to expose semiconductor surfaces of features for forming N regions. FIG. 2G provides an example substrate whereby mask 106 is used to mask implanted P region 110 and expose feature 130a. In operation 206b, material is lightly implanted into features for fabrication of lightly implanted N regions. FIG. 2H shows an example of plasma 108 implanting into feature 130a toward region 131a. FIG. 2I shows a lightly implanted region 114 for an N region. Note that the implantation may occur through the liner layer 104, as shown in both FIGS. 2H and 2I.

The N region may be implanted with materials having a bandgap less than about 0.3 eV. Example materials include erbium, ytterbium, dysprosium, and gadolinium. These materials are prone to oxidation but since they are capable of being implanted through the liner layer, the liner layer protects these materials from being oxidized. Like operation 204b, implantation depth may be between about 1 nm and about 4 nm, or between about 1 nm and about 2 nm. Implantation may likewise be performed by PIII or pulsed PIII as described above with respect to operation 204b. Like operation 204b, example doping concentrations may be about $5 \times 10^{14}$ atoms/cm$^2$ on the surface of the semiconductor substrate.

Figure 2J:
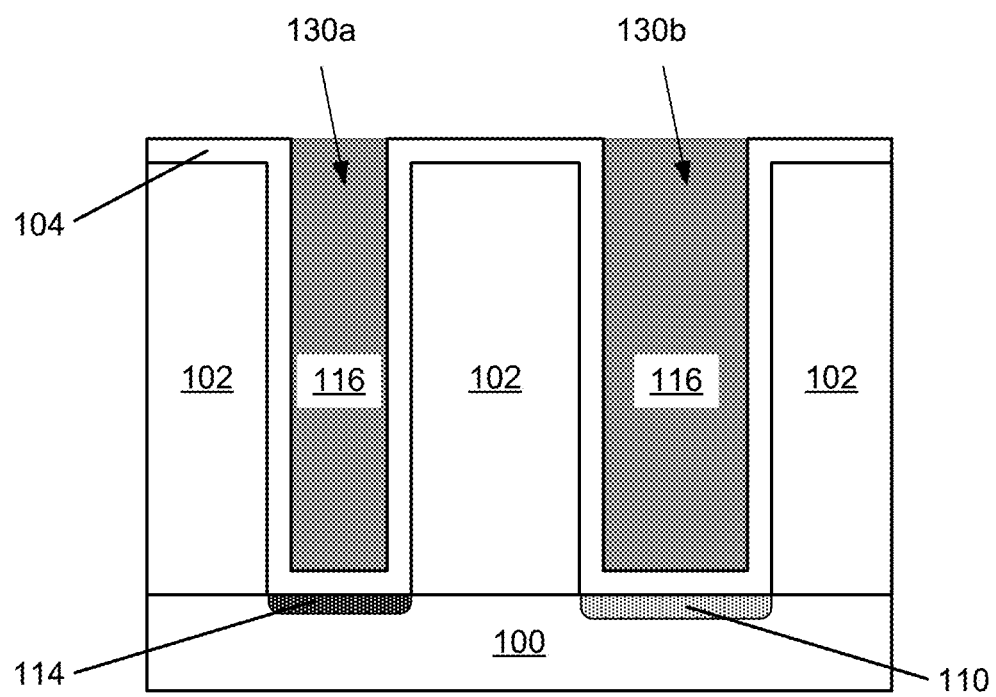

As described above with respect to FIG. 1, after operation 195 (such as after operation 206 of FIG. 2A), operation 199 may be performed whereby features are filled with bulk metal. FIG. 2J provides an example substrate whereby the substrate in FIG. 2I is filled with a bulk metal 116 into features 130a and 130b to form contacts over the n-type semiconductor 114 and p-type semiconductor 110.

FIG. 3 provides a process flow diagram depicting another example integration scheme for operation 195 of FIG. 1. In operation 304a, features may be masked such that only semiconductor materials used to form p-type semiconductors are exposed. As described above with respect to operation 204a of FIG. 2A, this may be performed by forming a patterned photoresist over the substrate. Note that in this example embodiment, a liner layer is not deposited prior to masking.

In operation 304b, a material is implanted into the features to form a p-type semiconductor at the bottom of various features. As described above with respect to operation 204b of FIG. 2A, Example materials include material with a band gap greater than 0.8 eV, such as iridium, platinum, and osmium. Implantation depth may be between about 1 nm and about 4 nm, or between about 1 nm and about 2 nm. Material may be implanted by PIII or pulsed PIII as described above.

In operation 302, a liner layer may be deposited over the substrate. The liner layer may be a silicon nitride layer deposited by CVD. In various embodiments, the liner layer may be conformally deposited by ALD. This material may be deposited over the features to protect the lightly implanted p-type semiconductor material. For example, in various embodiments, some materials may be prone to oxidation, and a layer of silicon nitride deposited over the doped p-type semiconductor material may prevent the material from being oxidized. The mask may be subsequently etched and/or removed after depositing the liner layer in operation 302.

In operation 306a, a patterned mask may be formed over the substrate to mask the lightly implanted p-type semiconductor material. In operation 306b, material is implanted into the features to form a lightly implanted n-type semiconductor material. Note that in some embodiments, operations 304a and 304b may be performed prior to 306a and 306b, or vice versa (e.g., the fabrication of n-type and p-type semiconductor materials may be fabricated in any suitable order). In various embodiments, the material deposited in operation 306b may be any of those described with respect to operation 206b in FIG. 2A, including erbium, ytterbium, dysprosium, and gadolinium.

In operation 312, a second liner layer may be deposited over the features. The second liner layer may be the same material as the first liner material deposited in operation 302. In various embodiments, the second liner layer is a silicon nitride layer. The silicon nitride layer here may also likewise be deposited to protect the lightly implanted n-type semiconductors from oxidation. For example, the substrate may be transferred to another chamber or tool for subsequent processing and the liner layer may be deposited to protect the doped semiconductor material from being oxidized during transfer.

In operation 308, the liner layers are etched to expose the implanted N and P regions. In various embodiments this is performed prior to filling the features with metal (see, e.g., operation 199 of FIG. 1, which may follow operation 308 of FIG. 3).

FIG. 4 provides another process flow diagram for an example implementation of disclosed embodiments for operation 195 of FIG. 1. In operation 404a, a patterned mask may be formed over the substrate to mask some features and expose other features that will be used to form a doped p-type semiconductor material. In various embodiments, operation 404a may be involve the same methods, techniques, and conditions as those described above with respect to operation 204a in FIG. 2A and operation 304a of FIG. 3. In operation 404b, material is implanted into the feature to form a lightly implanted p-type semiconductor. In various embodiments, operation 404b may include methods, techniques, materials, and conditions such as those described above with respect to operation 204b in FIG. 2A and operation 204b in FIG. 3. For example, iridium, platinum, or osmium may be implanted using PIII or pulsed PIII in operation 404b.

In operation 402, a liner layer may be deposited over the features. In various embodiments, the liner layer is a silicon nitride layer. Like operation 302 in FIG. 3, this liner layer may be deposited to protect the lightly implanted p-type semiconductor material. As described above, the liner layer may be deposited by ALD or CVD or any other suitable deposition method. In various embodiments, the liner layer deposited in operation 402 is conformal.

In operation 408, the liner layer is etched to expose the doped P region. Methods, techniques, and conditions may be any of those described above with respect to operation 308 of FIG. 3. In operation 410, an iridium, platinum, or osmium material may be deposited into the features as a metal contact layer. Note in the example provided in FIG. 4, iridium, platinum, or osmium is used as a contact metal. Such material may be deposited by PVD, CVD, or ALD.

Apparatus

Implantation in various embodiments may be performed using an apparatus such as a plasma-immersion ion implantation (PIII) system. Example PIII systems include the Pulsion Nano or Pulsion HP available from Ion Beam Services of Austin, Tex. In some embodiments, implantation may be performed using a plasma chamber including a plasma generator capable of generating a low energy plasma. In some embodiments, plasma may be generated in a vacuum chamber using an electron cyclotron resonance (ECR) plasma source, a capacitively coupled plasma source, an inductively coupled plasma source, or other suitable plasma source.

In various embodiments, the apparatus includes one or more chambers suitable for processing semiconductor substrates.

Figure 5:
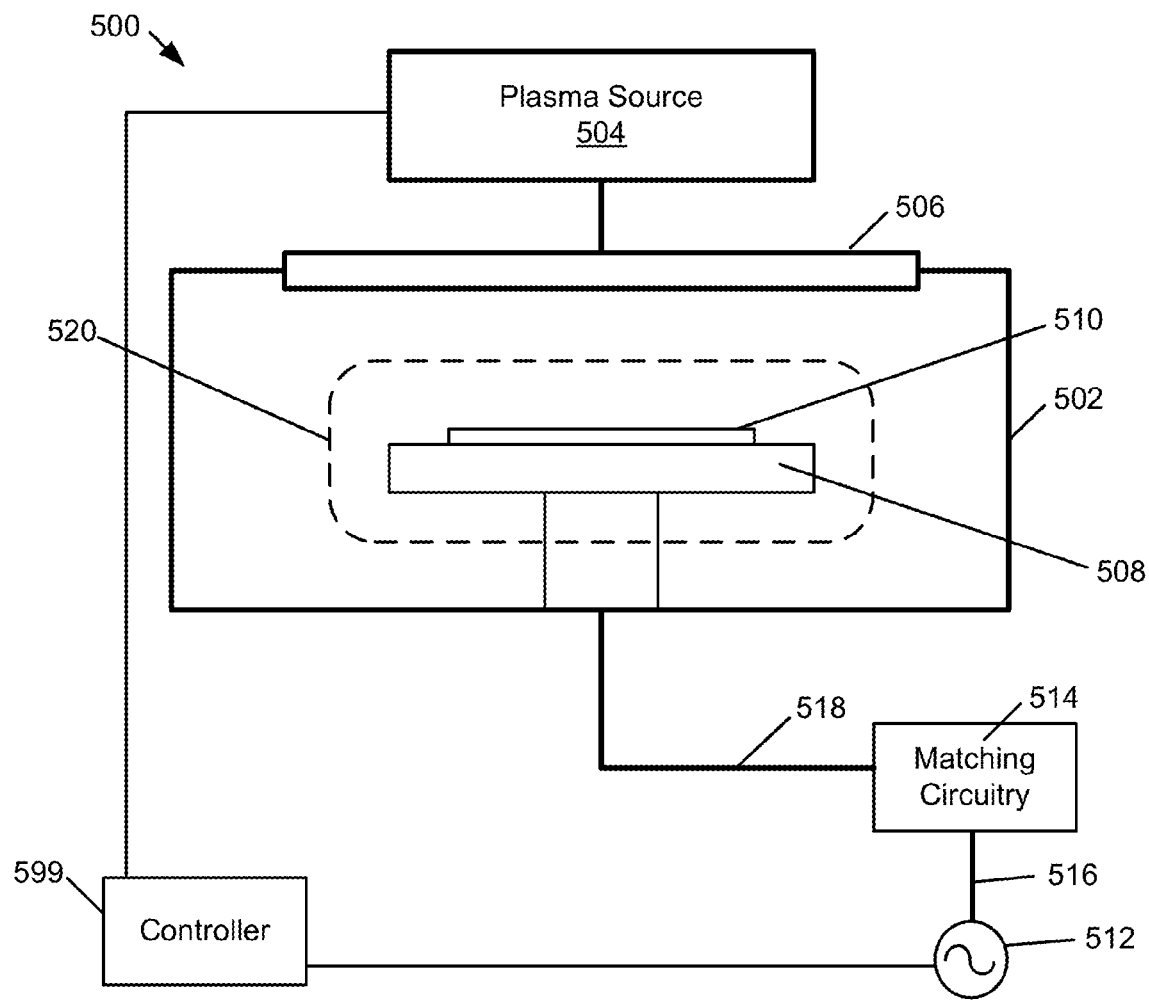
FIG. 5 is a schematic illustration of an example apparatus for performing certain embodiments.

FIG. 5 is a schematic illustration of an example apparatus for performing certain disclosed embodiments using PII. Apparatus 500 includes a process chamber 502 and a plasma source 504. In some embodiments, the process chamber 502 is a vacuum chamber. The process chamber 502 includes a coupling mechanism 506 which connects the plasma source 504 to the process chamber 502. The coupling mechanism 506 may include an ion shutter in various embodiments. The coupling mechanism 506 allows plasma species, such as ions and electrons, to enter process chamber 502 from the plasma source 504.

Plasma source 504 may be any suitable type of plasma source, such as high density plasma sources, electron cyclotron resonance (ECR) plasma source, a capacitively coupled plasma (CCP) source, an inductively coupled plasma (ICP) source, a transformer coupled plasma (TCP) source, a helicon plasma source, or other suitable plasma source. In some embodiments, plasma source 504 is a separate upstream chamber that generates plasma. In various embodiments, the plasma is generated in the separate chamber to reduce damage to a substrate or wafer 510 housed in the process chamber 502.

The chamber 502 includes a chuck or substrate holder 508 suitable for supporting or holding the substrate 510. The chuck 508 is configured to receive and hold a substrate 510 upon which implantation are performed. The chuck 508 can be an electrostatic chuck for supporting the substrate 510 when present. The chuck 508 also includes electrostatic electrodes for chucking and dechucking the substrate 510. A filter and DC clamp power supply (not shown) may be provided for this purpose. For example, in some embodiments, the power supply (not shown) may be high voltage pulsed direct current (DC) power supply or a high voltage pure DC power supply. Other control systems for lifting the substrate 510 off the chuck 508 can also be provided. The chuck 417 can be electrically charged using an RF power supply 512. The RF power supply 512 is connected to matching circuitry 514 through a connection 516. The matching circuitry 514 is connected to the chuck 508 through a connection 518. In this manner, the RF power supply 512 is connected to the chuck 508. In some embodiments, a bias power of the chuck 508 may be set at a power sufficient to control the implantation of materials such as ytterbium at a shallow depth between about 1 nm and about 4 nm.

In various disclosed embodiments, a gas including platinum, iridium, osmium, erbium, ytterbium, dysprosium, gadolinium, or combinations thereof may be fed into the plasma source 504 to generate a plasma. The plasma may be generated outside of the process chamber 502. In various embodiments, the plasma may generate one or more plasma and/or reactive species, such as ions, radicals, neutral species, and other plasma species. The plasma species may enter the process chamber 502 through coupling mechanism 506. The chuck 508 and substrate 510 may be biased to a negative voltage such that an electric field drives electrons away from the substrate 510, thereby forming an electron depleted sheath 520. The negatively-biased substrate 510 may accelerate positively charged ions towards it, some of which are then implanted on the substrate 510. As described elsewhere herein, such implantation may be performed so as to implant material onto a semiconductor material on the substrate 510 to form an n-type or p-type semiconductor as part of a dual silicide structure. When the chuck 508 and the substrate 510 are biased to a positive voltage, the sheath 520 may collapse to neutralize charging of the chuck 508 and substrate 510. In various embodiments, pulsed PIII may be performed. An example range of voltage pulses applied to the chuck 508 and the substrate 510 may be between about 5 microseconds and about 100 microseconds, with a duration of about 0.1 milliseconds to about 2 milliseconds between each pulse. In various embodiments, platinum, iridium, osmium, erbium, ytterbium, dysprosium, or gadolinium, ions are implanted onto substrates to a depth between about 1 nm and about 5 nm, or between about 1 nm and about 2 nm on a semiconductor material, such as silicon, silicon germanium, silicon carbide, silicon carbon phosphide, or combinations thereof. The directionality and extent of implantation can be tailored depending on the implantation energy and dose (e.g., amount of atoms generated from the plasma). The concentration of doping may be modulated to achieve a ratio of silicon to the material of about 1:1. For example, concentration of doping may be selected to achieve a ratio of silicon to platinum of about 1:1. Example doping concentrations may be about $5\times10^{14}$ atoms/cm$^2$ on the surface of the semiconductor material.

The apparatus may include a system controller 599. In some implementations, a controller 599 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 599, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 599 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 599 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 599, in some implementations, may be a part of or coupled to a computer that is integrated with, coupled to the system, otherwise networked to the system, or a combination thereof. For example, the controller 599 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 599 receives instructions in the form of data, which specify parameters for each of the processing steps to be performed during one or more operations. It should be understood that the parameters may be specific to the type of process to be performed and the type of tool that the controller 599 is configured to interface with or control. Thus as described above, the controller 599 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 599 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of forming contacts on a substrate, the method comprising:
   (a) after etching the substrate to form two or more contact holes, forming a p-type semiconductor by implanting a first material selected from the group consisting of platinum, iridium, and osmium by plasma immersion ion implantation into a first contact hole; and (b) forming a n-type semiconductor by implanting a second material selected from the group consisting of erbium, ytterbium, dysprosium, and gadolinium by plasma immersion ion implantation into a second contact hole.

2. The method of claim 1, further comprising prior to (a), conformally depositing a liner layer comprising titanium on the substrate.

3. The method of claim 2, wherein the first material is implanted through the liner layer.

4. The method of claim 2, wherein the second material is implanted through the liner layer.

5. The method of claim 1, wherein the first material is deposited to a depth between about 1 nm and about 4 nm.

6. The method of claim 1, wherein the second material is deposited to a depth between about 1 nm and about 4 nm.

7. The method of claim 1, wherein doping concentration of the first material is about $5\times10^{14}$ atoms/cm$^2$.

8. The method of claim 1, wherein doping concentration of the second material is about $5\times10^{14}$ atoms/cm$^2$.

9. The method of claim 1, wherein a region of the second contact hole comprises semiconductor material selected from the group consisting of silicon and silicon germanium.

10. The method of claim 1, wherein a region of the first contact hole comprises semiconductor material selected from the group consisting of silicon, silicon carbide, and silicon carbon phosphide.

11. The method of claim 1, further comprising (c) after forming the n-type semiconductor and the p-type semiconductor, filling the two or more contact holes with a metal.

12. The method of claim 11, wherein filling the two or more contact holes with the metal comprises depositing fluorine-free tungsten.

13. The method of claim 12, wherein the fluorine-free tungsten is deposited in the two or more contact holes without depositing a liner layer.

14. The method of claim 12, wherein the fluorine-free tungsten is deposited by exposing the substrate to a metal organic tungsten-containing precursor and a reducing agent.

15. The method of claim 12, wherein the fluorine-free tungsten is deposited by exposing the substrate to a chlorine-containing tungsten-containing precursor and a reducing agent.

16. The method of claim 12, wherein fluorine-free tungsten is deposited directly on the implanted n-type and p-type semiconductors.

17. The method of claim 11, further comprising:
(d) depositing a first silicon nitride layer by chemical vapor deposition between performing (a) and (b);
(e) depositing a second silicon nitride layer by chemical vapor deposition after performing (b); and
(f) opening the first and silicon nitride layer prior to performing (c).

18. The method of claim 11, wherein filling the two or more contact holes with the metal comprises electroplating copper onto the substrate.

* * * * *